(12) United States Patent
Song et al.

(10) Patent No.: US 9,136,047 B2
(45) Date of Patent: Sep. 15, 2015

(54) METHOD OF FORMING LOW-RESISTANCE METAL PATTERN, PATTERNED METAL STRUCTURE, AND DISPLAY DEVICES USING THE SAME

(71) Applicant: SAMSUNG DISPLAY CO., LTD., Yongin, Gyeonngi-Do (KR)

(72) Inventors: Ki Yong Song, Seoul (KR); Sung Hen Cho, Seoul (KR); Sang Eun Park, Yongin-si (KR)

(73) Assignee: SAMSUNG DISPLAY CO., LTD. (KR)

( * ) Notice: Subject to any disclaimer, the term of this patent is extended or adjusted under 35 U.S.C. 154(b) by 0 days.

(21) Appl. No.: 13/941,947

(22) Filed: Jul. 15, 2013

(65) Prior Publication Data

US 2013/0299450 A1 Nov. 14, 2013

Related U.S. Application Data

(62) Division of application No. 11/833,542, filed on Aug. 3, 2007, now abandoned.

(30) Foreign Application Priority Data

Feb. 28, 2007 (KR) .................. 10-2007-0020168

(51) Int. Cl.
*C23C 18/30* (2006.01)
*H01B 13/00* (2006.01)
*C23C 18/16* (2006.01)
*C23C 18/18* (2006.01)
*C23C 18/31* (2006.01)
*H05K 3/10* (2006.01)
*H05K 3/24* (2006.01)
*H01L 27/12* (2006.01)
*G02F 1/1362* (2006.01)
*H05K 3/38* (2006.01)

(52) U.S. Cl.
CPC ........ *H01B 13/0026* (2013.01); *C23C 18/1605* (2013.01); *C23C 18/1692* (2013.01); *C23C 18/1696* (2013.01); *C23C 18/1889* (2013.01); *C23C 18/30* (2013.01); *C23C 18/31* (2013.01); *H01L 27/124* (2013.01); *H01L 27/1255* (2013.01); *H05K 3/108* (2013.01); *H05K 3/24* (2013.01); *G02F 2001/136295* (2013.01); *H05K 3/388* (2013.01); *H05K 2203/072* (2013.01); *H05K 2203/0716* (2013.01); *Y10T 428/24917* (2015.01)

(58) Field of Classification Search
CPC .. C23C 18/1605; C23C 18/1607; C23C 18/30
USPC ............ 427/99.5, 304, 305, 443.1, 97.3, 98.4
See application file for complete search history.

(56) References Cited

U.S. PATENT DOCUMENTS

| 5,112,699 A | 5/1992 | Chang |
| 5,534,312 A * | 7/1996 | Hill et al. ..................... 427/533 |
| 5,777,824 A | 7/1998 | Gray |

(Continued)

*Primary Examiner* — Dah-Wei D Yuan
*Assistant Examiner* — Nga Leung V Law
(74) *Attorney, Agent, or Firm* — Cantor Colburn LLP

(57) ABSTRACT

Disclosed herein is a method of forming low-resistance metal pattern, which can be used to obtain a metal pattern having stable and excellent characteristics by performing sensitization treatment using a copper compound before an activation treatment for forming uniform and dense metal cores, a patterned metal structure, and display devices using the same.

11 Claims, 11 Drawing Sheets

(56) References Cited

U.S. PATENT DOCUMENTS

2002/0168223 A1 11/2002 Wu et al.
2003/0079995 A1 5/2003 Contolini et al.
2007/0095389 A1 5/2007 Cho et al.
2007/0128857 A1* 6/2007 Jenq et al. .................... 438/643
2008/0044559 A1* 2/2008 Noh et al. .................... 427/145

* cited by examiner

METHOD OF FORMING LOW-RESISTANCE METAL PATTERN, PATTERNED METAL STRUCTURE, AND DISPLAY DEVICES USING THE SAME

CROSS-REFERENCE TO RELATED PATENT APPLICATIONS

This application is a divisional of U.S. patent application Ser. No. 11/833,542, filed on Aug. 3, 2007, which claims priority to Korean Patent Application No. 10-2007-0020168, filed on Feb. 28, 2007, and all the benefits accruing therefrom under 35 U.S.C. §119, the content of which is incorporated herein by reference in its entirety.

BACKGROUND OF THE INVENTION

1. Field of the Invention

The present invention relates to a method of forming a low-resistance metal pattern, a patterned metal structure and display devices using the same, and, more particularly, to a method of forming low-resistance metal pattern, which can be used to obtain metal pattern having stable and excellent characteristics by performing sensitization treatment using a copper compound before activation treatment to form uniform and dense metal cores, a patterned metal structure, and display devices using the same.

2. Description of the Related Art

As electronic devices gradually become miniaturized and increasingly integrated, the pattern width decreases so that the resistance of metal pattern increases, which causes signal delayed, thereby deteriorating the display quality of the electronic devices. Accordingly, the problems can become significant obstacles to the development of TFT-LCDs having high image quality and large areas. In order to realize high-speed and highly integrated electronic devices and products, copper (Cu), which has lower electric resistance and higher charge mobility than conventional aluminum, molybdenum and chromium, and thus is able to overcome the delay of driving signals (RC delay), is useful as a pattern material to produce such devices and products. Copper has low specific resistance and excellent electromigration resistance. Attempts to develop various novel technologies that take advantage of the characteristics of copper are continuously being made.

In electronic devices, such as integrated circuits ("IC"), liquid crystal display devices ("LCD"), and the like, metal patterns, which are formed on a substrate, are gradually being miniaturized to accommodate the increase in the degree of integration required in such devices from the miniaturization of these devices. To form metal micropatterns on a substrate by a conventional method, a metal pattern is formed by sputtering the entire surface of a substrate with metal, forming a pattern thereon by a photolithography process using a photoresist, and then etching the exposed metal to form a metal pattern, and removing the photoresist.

Since these conventional methods of forming a metal pattern need expensive equipment and use methods such as a sputtering method which must be performed at a high temperature, the number of such processing steps that are required and the investment cost for manufacturing the necessary equipment are each high, which increases the overall manufacturing cost.

However, among the methods of forming copper pattern, an electroless plating method which plates a metal film by the reaction of a reductant and an oxidant in solution to provide the metal at the surface of an activated substrate. Advantageously, since the electroless plating method is simultaneously performed over the entire substrate, the manufacturing cost is low, processes are simple, and productivity is high.

In the electroless plating method, since a metal film is directly plated on a diffusion-preventing film using an electrochemical method, any microstructures located at the interface between the diffusion preventing film and the metal film, reactions occurring on the interface, and the like, have an influence on all of the characteristics of the metal pattern provided thereby, including electrical properties, thermal stability, and the like. Further, in an exemplary electroless plating method, catalyst metal cores are formed on a lower conductive pattern film by activating the lower conductive pattern film before the formation of the plated metal layer. Since the catalyst metal cores catalyze the plating process, the plating process can thus be readily performed. Accordingly, a technology for forming uniform and dense catalyst metal cores in an activation process is an important aspect of the technology for forming a stable plated layer having desirable qualities through the electroless plating process.

To perform an activation process when the electroless plating is conducted on an insulating film, methods of performing sensitization treatment using $SnCl_2$ are known. These methods are performed for the purpose of increasing the uniformity and density of metal cores formed by the activation process.

However, a plated film formed by activation treatment performed using tin and palladium has insufficient adhesion to the substrate, and thus it is unsuitable for practical use.

BRIEF SUMMARY OF THE INVENTION

Accordingly, the present invention has been made to overcome the above problems of the prior art, and in an embodiment, a method of forming low-resistance metal pattern is provided, which can be used to obtain an electroless plated layer having stable and desirable characteristics by performing sensitization treatment with a copper compound before activation treatment to form uniform and dense metal cores in the process of forming a metal pattern using an electroless plating method.

In another embodiment, a low-resistance metal pattern is provided which can provide a plated layer having stable and desirable characteristics.

In another embodiment, a display device including the metal pattern is provided.

In an embodiment, a method of forming a low-resistance metal pattern is provided, in which the metal pattern is formed by forming a plurality of metal cores by performing sensitization treatment of the substrate with a copper compound, activating a surface of the sensitized substrate, and forming a plated layer on the activated surface of the substrate.

In a further embodiment, the method can include forming a lower conductive pattern film on a surface of an insulated substrate, performing a sensitization treatment on a surface of the lower conductive pattern film with a copper compound, activating the sensitized surface of the substrate to form a multi-layered catalyst film comprising a plurality of catalyst metal cores thereon, and forming one or more plated layers on a surface of the activated multi-layered catalyst film.

To accomplish the above, in another embodiment, a patterned metal structure is provided, including a substrate, a lower conductive pattern film formed on a surface of the substrate, and an upper conductive pattern film formed on a surface of the lower conductive pattern film opposite the substrate, wherein the structure includes a seed layer including both a copper compound and a palladium compound, disposed between the lower conductive pattern film and the upper conductive pattern film.

The patterned metal structure can include a lower conductive pattern film layered on a surface of a substrate, a seed layer including a copper compound and a palladium compound, formed on a surface of the lower conductive pattern film opposite the substrate, and an upper conductive pattern film formed on a surface of the seed layer opposite the lower conductive film.

To accomplish the above, in an embodiment, a display device includes the patterned metal structure. In particular, the patterned metal structure can be applied to the construction of a liquid crystal display device such that the liquid crystal display device comprises the patterned metal structure.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE INVENTION

Figure 1:
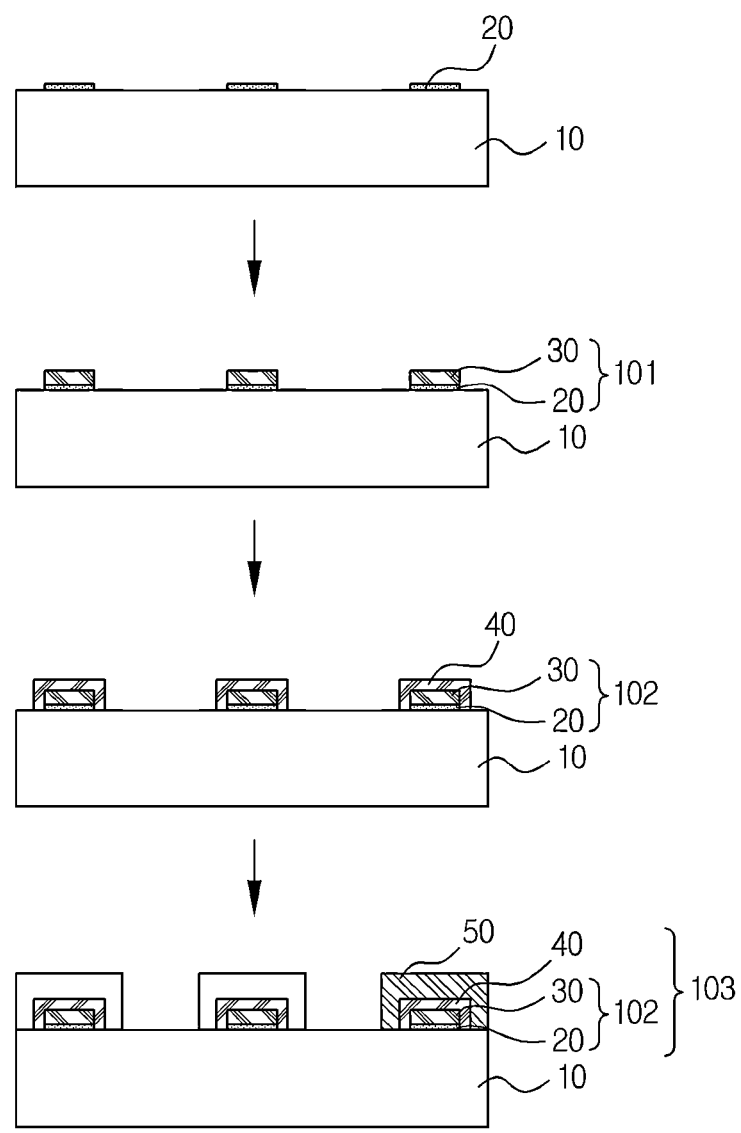
FIG. 1 is a flow chart of the method of forming low-resistance metal pattern according to an exemplary embodiment.

Hereinafter, the present invention will be described in detail with reference to the attached drawings.

It will be understood that when an element is referred to as being "on" another element, it can be directly on the other element or intervening elements may be present therebetween. In contrast, when an element is referred to as being "disposed on" or "formed on" another element, the elements are understood to be in at least partial contact with each other, unless otherwise specified. Terms such as "upper", "lower", "between", and the like are labels provided to show relative positions of elements relative to one another, and should not be construed as absolute positions.

The terminology used herein is for the purpose of describing particular embodiments only and is not intended to be limiting of the invention. As used herein, the singular forms "a", "an" and "the" are intended to include the plural forms as well, unless the context clearly indicates otherwise. The use of the terms "first", "second", and the like do not imply any particular order but are included to identify individual elements. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

In the drawings, like reference numerals in the drawings denote like elements and the thicknesses of layers and regions are exaggerated for clarity.

Reference now should be made to the drawings, in which the same reference numerals are used throughout the different drawings to designate the same or similar components.

A method of forming low-resistance metal pattern, in which the metal pattern is formed by forming a plurality of metal cores by activating the surface of a patterned substrate and then forming a plated layer thereon, which includes performing sensitization treatment of the surface using a copper compound before the activation treatment of the sensitized substrate.

Figure 2:
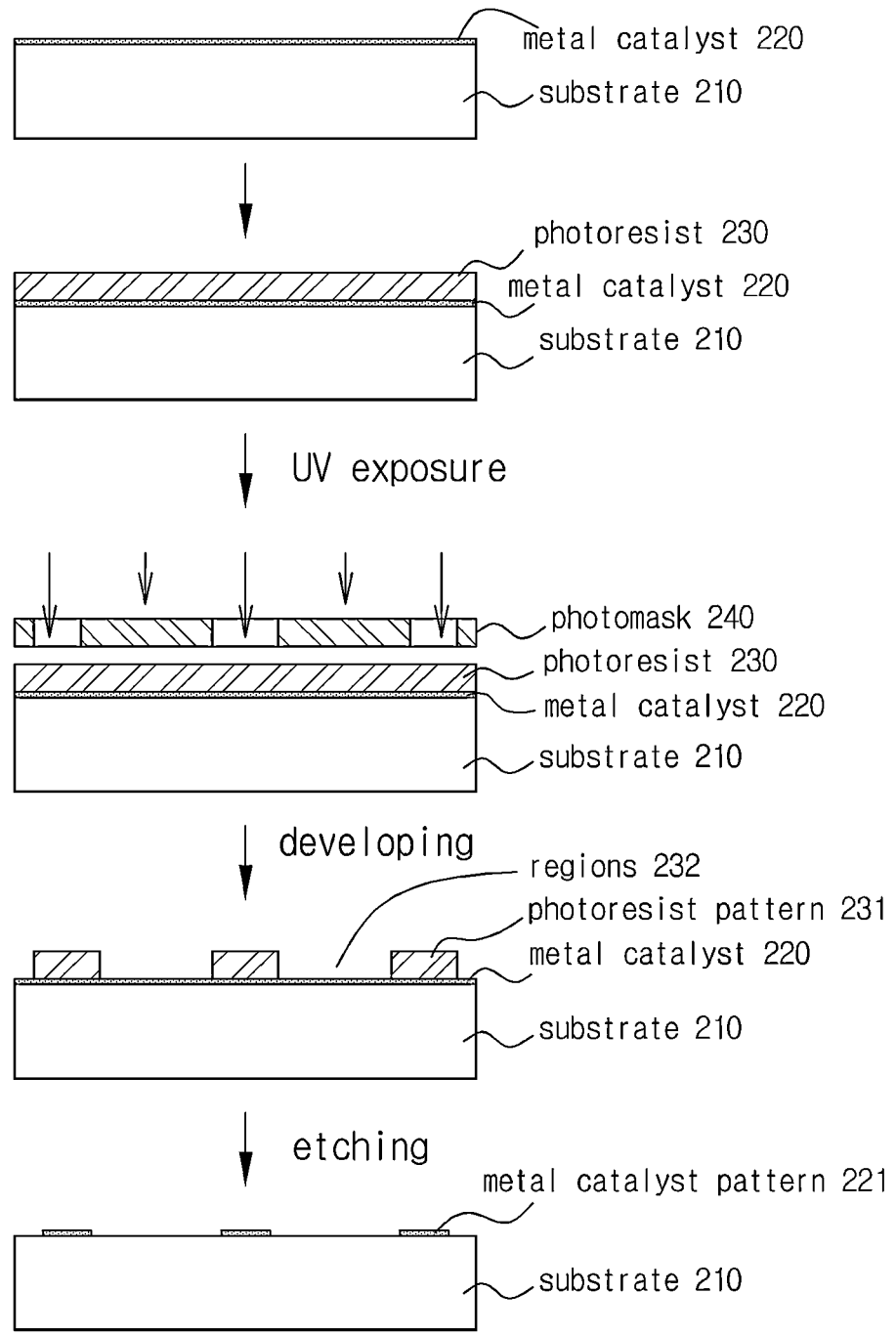
FIG. 2 is a flow chart of the process of forming an exemplary lower conductive pattern film by the method of forming low-resistance metal pattern according to an embodiment.

FIG. 1 is a flow chart of the method of forming low-resistance metal pattern, and FIG. 2 is a flow chart of the process of forming a lower conductive pattern film.

Referring to FIG. 1, in a method of forming a low-resistance metal pattern, a lower conductive pattern film 101 is formed on a surface of an insulating substrate 10. This lower conductive pattern film is formed by patterning a metal thin film 20 on the substrate 10. A copper seed layer 30 is formed on the metal thin film 20 opposite substrate 10 to form the lower conductive pattern film 101, and thereby sensitization treatment of the metal thin film 20 is performed. Subsequently, the sensitized substrate is activated using a palladium compound, to provide a palladium seed layer 40 layered on a surface of the copper seed layer 30 opposite the metal thin film 20, to form a plurality of catalyst metal cores. The catalyst metal cores constitute a multi-layered catalyst film 102 having two or more layers. For example, when the sensitization treatment is performed using a copper compound and the activation treatment is performed using a palladium compound, a two-layered catalyst film, consisting of a copper catalyst film and a palladium catalyst film, can be formed. Finally, the low-resistance metal pattern 103 can be formed by forming one or more plated layers 50 on a surface of the activated multi-layered catalyst film 102 opposite the substrate 10.

Hereinafter, each step will be described in more detail with reference to FIGS. 1 and 2.

(i) Forming a Lower Conductive Pattern Film

A lower conductive pattern film may be formed according to general methods of forming metal pattern film. In an exemplary embodiment, in FIG. 2, a metal thin film (metal catalyst film) 220 is first formed on a surface of a substrate 210.

The substrate material that can be used is not limited, but a plastic substrate or a glass substrate is desirably used as the substrate 210.

Metal thin film materials that can be used to form a lower conductive pattern film include, but are not limited to, molybdenum, nickel, copper, titanium, tantalum, tungsten and alloys thereof. The metal thin film may be deposited to a thickness of about 5 to about 500 nm.

Subsequently, a photosensitive film 230 is formed on a surface of the metal thin film 220 by applying a photoresist composition thereon. The photosensitive film 230 is selectively UV-exposed using a photo mask 240, developed, and thus patterned to form a photoresist pattern 231. In this case, usable photoresist compositions, exposure conditions and the like are not limited. The metal catalyst 220 that is exposed in the opened regions 232 of the photoresist pattern 231 are etched to expose the underlying surface of substrate 210 and create a metal catalyst pattern 221 using an etchant, and subsequently, the photosensitive film comprising the photoresist pattern 231 remaining undesirably over the metal catalyst pattern 221 is removed. For the etching process, in an embodiment, an etchant whose main component is nitric acid, hydrochloric acid, phosphoric acid, acetic acid or hydrogen peroxide may be used.

(ii) Sensitization Treatment

Electroless plating proceeds by autocatalytic nucleation and growth, and requires seeds, i.e., small metal particles, to initiate a reaction to plate the metal. Since most metals cannot themselves function as their own catalysts, it is necessary to form metal cores for the growth of metal by performing sensitization and activation treatment before metal can be deposited by electroless plating.

When the lower conductive pattern film is formed, sensitization treatment of the surface of the lower conductive pattern film is performed by use of a copper compound. In this case, the copper compound can be, but is not limited to, copper, a copper alloy, copper sulfate, or copper chloride.

The sensitization treatment can be performed by immersing the lower conductive pattern film into a sensitization solution that includes the copper compound. In an exemplary embodiment, 0.01 M to 0.1 M aqueous copper sulfate can be used for the sensitizing solution. The sensitization treatment may be performed at a temperature of about 20 to about 80° C. for about 5 to about 100 seconds. When the sensitization treatment is completed, the lower conductive pattern film can be washed using deionized water in order to remove the remaining sensitization solution.

Before the sensitization treatment, the lower conductive pattern film can be pretreated using an acid solution, such as nitric acid, or the like, to increase the contact between the metal catalyst of the lower conductive pattern film and the copper thin film formed by the sensitization treatment, by selectively increasing the roughness of the surface of the lower conductive pattern film. In an exemplary embodiment, an aqueous solution of 10 to 30% (v/v) of nitric acid is used.

Copper seeds are formed on the lower conductive pattern film by the sensitization treatment process, thereby increasing the number of nucleation sites available in the activation treatment process, which is a post-process. Accordingly, the density and uniformity of the metal cores provided after treatment using the activation treatment process can each increase, thereby improving the characteristics, such as electrical conductivity, adhesivity and the like, of the plated layer formed thereon through the subsequent electroless plating process.

(iii) Activation Treatment

After the sensitization treatment, activation treatment is performed on the sensitized layer to form an active layer for plating on the surface of metal cores. Generally, the activation treatment is performed by immersing the sensitized pattern film into an activation solution containing an activation treatment metal, such as palladium, at about room temperature for a predetermined time of, in an embodiment, 5 to 200 seconds. Upon activation treatment, a plurality of metal cores that act as a catalyst surface, are formed on the surface of the lower conductive pattern film, thereby providing a suitable surface on which to perform the electroless plating process.

The activation solution can include a palladium compound, such as palladium, a palladium alloy, or palladium chloride. The activation solution further comprises a solvent, such as for example, sulfuric acid, hydrochloric acid, hydrogen peroxide, or the like, but not limited thereto. In an embodiment, concentration of palladium compound in the solution is 1 to 100 mg/L. When the activation treatment is completed, the lower conductive pattern film may be washed using deionized water in order to remove the remaining activation solution.

When the sensitization and activation treatments are performed, metal cores are formed as a multi-layered catalyst film. These metal cores serve as catalysts for accelerating the growth of metal crystals in the subsequent plating process.

(iv) Forming a Plated Layer

A low-resistance metal pattern is then fabricated by forming one or more plated layers on a surface of the activated multi-layered catalyst film by an electroless plating process. In the plating step, metal crystals are grown from the plurality of metal cores formed on the lower conductive pattern film, thereby forming a metal pattern on a surface of the patterned activated multi-layered catalyst film. That is, the metal cores formed on the lower conductive pattern film aggregate with each other during growth of the crystals, and thus form islands, and these islands in turn combine with each other during further growth, thereby forming a continuous plated film.

During plating, a multi-layered metal pattern may be formed by growing two or more kinds of metals sequentially in a stepwise method. This plating treatment can be performed using either a wet electroless plating method or a wet electrolytic plating method.

Herein, when the sensitization treatment is performed using a copper compound and the activation treatment is performed using a palladium compound, the resulting metal pattern film having particles of palladium metal deposited at the surface of the metal pattern film has sufficient catalyst activity to accelerate the growth of crystals by a plating process, performed using an electroless plating solution, thereby providing a more precise metal pattern on the metal pattern film.

As a metal used for plating, Cu, Ni, Ag, Au, or alloys thereof can be selectively used depending on the use of the metal pattern. In order to obtain a highly conductive metal pattern, it is preferred that a copper metal compound solution or a silver metal compound solution be used.

Electroless plating or where desired, electrolytic plating, can be performed using conventional commonly known methods. For example, copper electroless plating is described below. The copper plating is performed by immersing the activated lower conductive pattern film into a plating solution containing 1) a copper salt, 2) a complexing agent for suppressing liquid phase reaction by forming a ligand with copper ions, 3) a reductant for reducing copper ions, 4) a pH adjuster for maintaining a suitable pH to oxidize the reductant, 5) a pH buffer, and 6) a modifier, for a predetermined time.

Specifically,

1) The copper salt may include, but is not limited to, copper chloride, copper nitrate, copper sulfate, or copper cyanide. In a specific embodiment, copper sulfate is used as the copper salt.

2) The reductant includes $NaBH_4$, $KBH_4$, $NaH_2PO_2$, hydrazine, formalin, or a polysaccharide such as glucose. In a specific embodiment, formalin or a polysaccharide such as glucose is used as the reductant.

3) The complexing agent includes a chelator such as an ammonia solution, acetic acid, guanic acid, a salt of tartaric acid, ethylenediamine tetraacetic acid ("EDTA"), Rochelle salt and the like, or an organic amine compound. In a specific embodiment, a chelator such as EDTA, a salt thereof, or the like is used as the complexing agent.

4) The pH adjuster can include an acidic compound such as, for example, $H_2SO_4$, or a basic compound such as, for example, sodium carbonate or sodium hydroxide, and 5) the pH buffer can include various organic acids such as formic acid or acetic acid, and weakly acidic inorganic compounds such as ammonium acetate or ammonium sulfate.

6) The modifier is a compound for improving the coating and flatness characteristics of a plated layer, and includes surfactants such as for example poly(ethylene glycol) polymers, or poly(ethylene glycol-propylene glycol) copolymers, and adsorptive materials such as for example bis(3-sulfopropyl)disulfide, 3-mercapto-1-propane sulfonic acid, 2-mercaptopyridine, 4-mercaptopyridine, and the like, for adsorbing components that suppress the growth of crystals.

Where an electrolytic plating method is used for growing copper metals, the plating can be performed by immersing the lower conductive pattern film into a plating composition containing 1) a copper salt, 2) a complexing agent, 3) a pH adjuster, 4) a pH buffer, and 5) a modifier.

Herein, an annealing process can be performed if desired in order to remove water remaining in low-resistance metal pattern obtained by forming a plated layer and to improve the electrical properties and adhesivity of the plated layer. The annealing process may be performed in a nitrogen, argon or vacuum atmosphere at a temperature of about 40 to about 400° C. for about 15 to about 120 minutes.

Further, after the formation of the plated layer, a protective layer can be formed to protect the low-resistance pattern. The protective layer can be formed of nickel or a nickel alloy.

In the method disclosed herein, patterns are formed and etched by vacuum deposition and photolithography only in the step of forming a lower conductive pattern film. Subsequently, the lower conductive pattern film is plated by a wet plating technology, which is a wet film formation technology, in which the processing cost is lower than that of vacuum deposition technology, thereby decreasing the total manufacturing cost. Further, in the wet film formation technology, since a film is formed in an aqueous solution, the temperature for the film formation is 100° C. or lower, and thus energy consumption is lower than for a dry film formation technology. Further, when the substrate being coated with a film is large, fewer restrictions on equipment are encountered compared to in the dry process, so that large metal pattern can be easily formed on a variety of substrates of different sizes.

In another embodiment, a patterned metal structure having excellent electrical properties, adhesivity, and processability is provided. The patterned metal structure includes a substrate, a lower conductive pattern film formed on a surface of the substrate, and an upper conductive pattern film formed on a surface of the lower conductive pattern film opposite the substrate, wherein the structure includes a seed layer, including a copper compound and a palladium compound, disposed between the lower conductive pattern film and the upper conductive pattern film.

Figure 3:
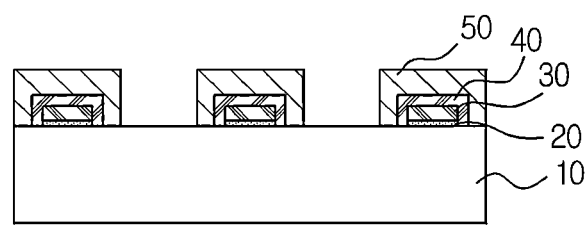
FIG. 3 is a schematic sectional view of the structure of the exemplary low-resistance metal pattern according to an embodiment.

FIG. 3 is a schematic sectional view of a patterned metal structure according to an embodiment. The patterned metal structure according to an embodiment can in general include a lower conductive pattern film layered on a surface of a substrate 10, a seed layer, including a copper compound and a palladium compound, formed on a surface of the lower conductive pattern film opposite the substrate 10, and an upper conductive pattern film formed on a surface of the seed layer opposite the lower conductive film. Specifically, in FIG. 3, the lower conductive pattern film is prepared by forming a metal thin film 20 on a surface of substrate 10, and the seed layer can include a combination of a copper seed layer 30 formed on a surface of metal thin film 20 opposite substrate 10, and a palladium seed layer 40 formed on a surface of copper seed layer 30 opposite metal thin film 20. The upper conductive pattern film, formed on a surface of the seed layer (i.e., palladium seed layer 40 in the present embodiment), corresponds to plated layer 50.

In the patterned metal structure, the metal thin film 20 is formed of a conductive material selected from the group consisting of molybdenum, nickel, copper, titanium, tantalum, tungsten, and alloys thereof. Meanwhile, the plated layer 50 forming the upper conductive pattern film can include, but is not limited to, a conductive material selected from the group consisting of nickel, copper, silver, gold and alloys thereof.

A seed layer placed between the lower conductive pattern film and an upper conductive pattern film includes a copper compound and a palladium compound. The seed layer can include a copper seed layer 30 which includes a copper compound, and a palladium seed layer 40 which includes a palladium compound. The copper compound constituting the copper seed layer 30 may be selected from the group consisting of copper, a copper alloy, copper sulfate, and copper chloride; and the palladium compound constituting the palladium seed layer 40 may be selected from the group consisting of palladium, a palladium alloy, and palladium chloride; but are not limited thereto.

The patterned metal structure can further include a protective layer (not shown), which is composed of nickel, a nickel alloy, or the like, formed on a surface of the upper conductive pattern film opposite the seed layer to protect the upper conductive pattern film.

In the patterned metal structure, the combination of strong adhesivity of the copper seed layer and the improved uniformity of the palladium seed layer provide the patterned metal structure with a low specific resistance of about 3.0 µΩ/cm or less, so that the structure has high electroconductivity and improved gloss, and the adhesivity of a plated film is improved.

The patterned metal structure can be used for various display devices, such as liquid crystal display ("LCD"), plasma display panels ("PDP"), electro luminescent displays ("ELD") and electrochromic displays ("ECD"), as well as flat sensor such as X-ray imaging device, and the like. In particular, where the patterned metal structure is used for liquid crystal displays, advantages realized include reduced manufacturing costs of the liquid crystal display, and large-sized liquid crystal displays can be manufactured.

Generally, a liquid crystal display device includes gate lines formed in a transverse direction, data lines formed in a longitudinal direction that intersect the gate lines, and thin film transistors that are formed at intersections of the gate lines and the data lines. Pixel electrodes connected with the thin film transistors through drain contact holes are formed in pixel regions, which are defined as the intersecting regions of the gate lines and the data lines. The thin film transistor includes gate electrodes branching from the gate lines, a semiconductor layer covering the gate electrodes, source electrodes which overlap both ends of the semiconductor layer at regular intervals and branch from the data lines, and drain electrodes which are spaced apart from the source electrodes and connect the pixel electrodes with the thin film transistor.

Figure 4:
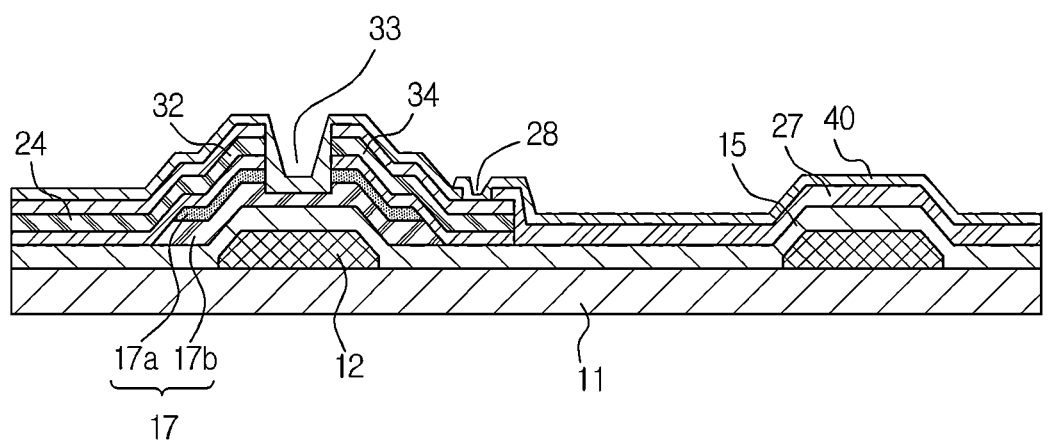
FIG. 4 is a schematic sectional view of an exemplary liquid crystal display device according to an embodiment.

FIG. 4 is a schematic sectional view of a liquid crystal display device including the patterned structure of an embodiment. As shown in FIG. 4, the liquid crystal device according to the embodiment includes a transparent substrate 11; gate electrodes 12 formed on a surface of the substrate 11; a gate insulating film 15, formed on a surface of the gate electrodes 12 opposite substrate 11; and a semiconductor layer 17, formed on the surface portion of the gate insulating film 15 covering the gate electrodes 12. Source electrodes 32 and drain electrodes 34, spaced apart from each other at intervals (not shown in the cross-sectional view of FIG. 4), are formed on the semiconductor layer 17, and channels 33 are formed in the gaps between the source electrodes 32 and the drain electrodes 24. The semiconductor layer 17 includes an active layer 17a formed of pure amorphous silicon (a-Si), and an ohmic contact layer 17b formed of impure amorphous silicon (n+a-Si) and placed on a surface of the active layer 17a. A protective layer 27, having drain contact holes 28 for partially exposing the drain electrodes 34, is formed in the upper portion of the thin film transistor, and pixel electrodes 40 connected with the drain electrodes 34 through the drain contact holes 28 are formed in pixel regions located in the upper portion of the protective layer 27. The liquid crystal display device is not limited to this structure, and can be variously modified, added to and substituted by those skilled in the art.

Hereinafter, exemplary embodiments of the invention will be described in detail with reference to Examples. Here, these Examples are set forth to illustrate the invention, but should not to be construed as limiting thereto.

EXAMPLES

Example 1

Molybdenum was deposited to a thickness of 50 nm on a glass substrate, and then the glass substrate, with the molybdenum thin film so formed, was spin-coated with an AZ1512 photoresist (Clariant Corp. positive tone photoresist). Subsequently, the photoresist-coated glass substrate was exposed through a photo mask using broadband UV exposure (equipment manufactured by Oriel Corp.) as a light source for 7 seconds so that the output of broad band UV resulted in a dose of 13 mJ/cm$^2$ in the exposed regions defined by the photomask, and was developed using a TMAH developer and patterned and the exposed molybdenum thin film etched using AT10 (manufactured by Dongwoo Fine-Chem Co. Ltd.) as an etchant, thereby obtaining a lower conductive pattern film.

Figure 5A:
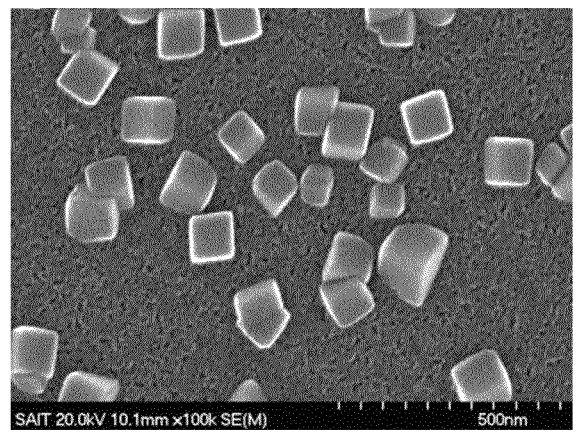
FIG. 5A to 5F are plan and side SEM (scanning electron microscope) micrograph showing the exemplary metal pattern film obtained in each step of Example 1.
Figure 5B:
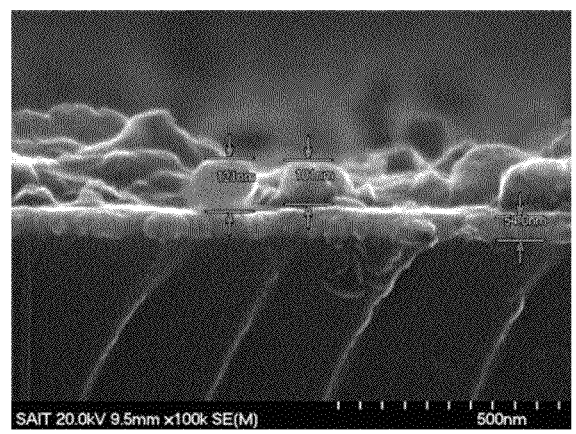

800 ml of deionized water was added to a 1.5 L vessel, 5.99 g of $CuSO_4.5H_2O$ was added thereto, and the mixture was then stirred. Subsequently, 26.99 g of EDTA.4Na was added thereto and stirred, and 7.47 ml of HCHO (37 wt % aqueous solution) was added thereto. Next, the pH of a plating solution was adjusted to 12.6 using sodium hydroxide (NaOH), and 5 ml of a 2,2-dipyridyl solution was then added thereto, to prepare a sensitization solution having the composition shown in (a) of the following Table 1. The sensitization solution was bubbled and simultaneously heated to a temperature of 60° C. After the bubbling and heating of the sensitization solution was stopped, the lower conductive pattern film was immersed into the sensitization solution for seconds, removed therefrom, and washed with water. FIG. 5A to 5B show plan and side SEM micrograph of the resulting sensitized metal pattern film.

A 2 l beaker was filled with 1 L of deionized water, 2 ml of conc. (aq.) HCl, and then 0.03 g of $PdCl_2$ was added thereto and stirred thoroughly until dissolved, to prepare the palladium activation solution having a composition shown in (b) of the following Table 1. This activation solution was stirred for about 1 hour, and was then introduced into a copper electroless double boiling apparatus, and then the sensitized pattern film obtained in the previous step was immersed therein for 60 seconds.

Figure 5C:
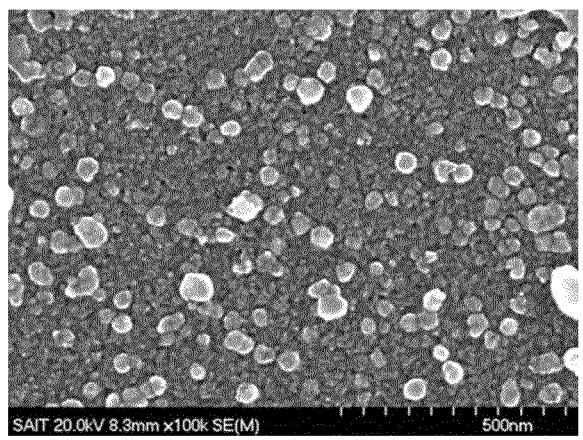
Figure 5D:
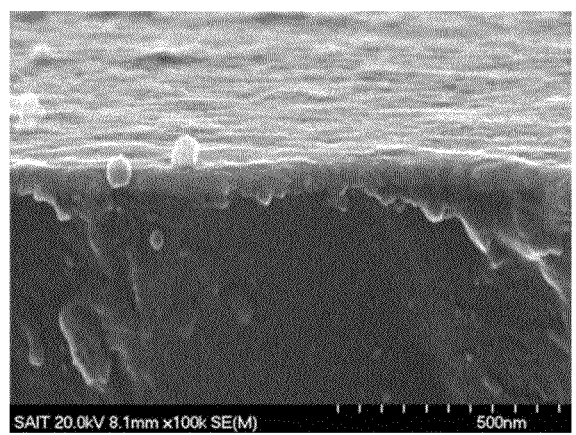
Figure 5E:
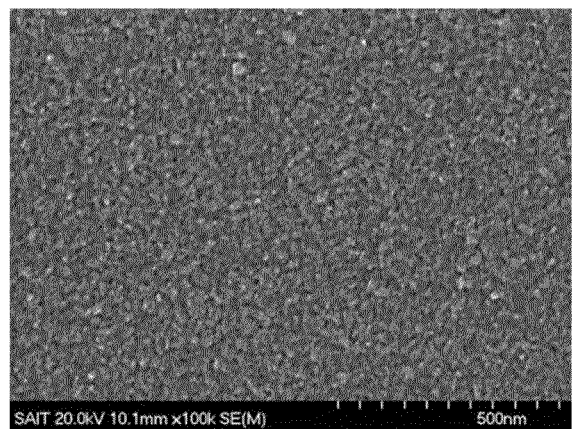
Figure 5F:
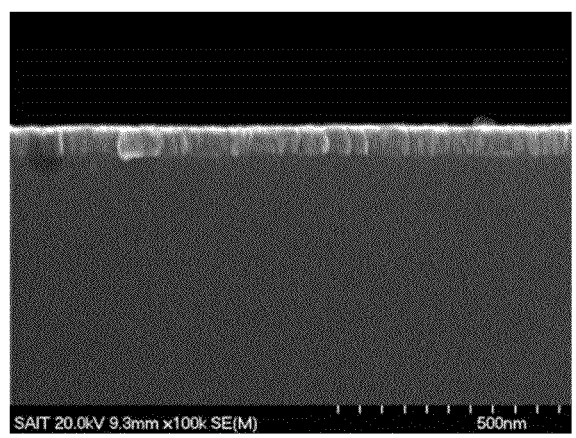

FIGS. 5C and 5D show plan and side SEM micrograph of the metal pattern film, activated for 10 seconds, and FIGS. 5E and 5F show plan and side SEM micrographs of the metal pattern film, activated for 60 seconds. Referring to FIG. 5A to 5F, it can be seen that metal cores were sparsely formed on the lower conductive pattern film during the first stage, but grew when the activation treatment was performed, so that they combined with each other to form a continuous thin film.

The metal pattern film so obtained was immersed into an electroless copper plating solution having the composition shown in (c) in the following Table 1 at a temperature of 65° C. for 5 minutes, so that copper metal crystals were grown on the lower conductive pattern film, thereby obtaining a copper pattern film.

Figure 6:
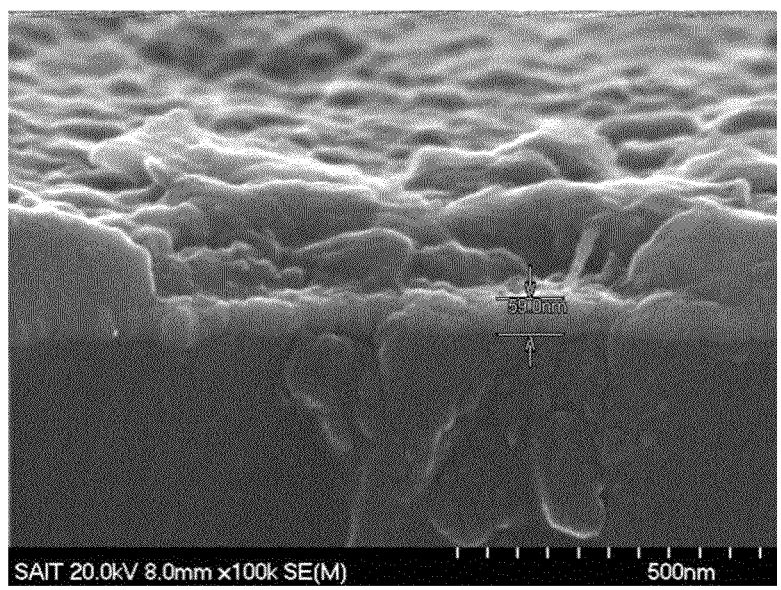
FIG. 6 is a side SEM micrograph showing the exemplary metal pattern film obtained in Example 1.

FIG. 6 showed a side SEM micrograph of the obtained metal pattern film plated with copper. As shown in FIG. 6, it can be seen that the plated film so obtained does not exhibit separation at the interface, and has high adhesivity.

TABLE 1

| (a) Sensitization solution | (b) Pd activation solution | (c) Copper plating solution |
|---|---|---|
| Deionized water 800 ml $CuSO_4•5H_2O$ 5.99 g EDTA•4Na 26.99 g HCHO (37 wt %) 7.47 ml 2,2-dipyridyl solution 5 ml | Deionized water 1 l Conc. hydrochloric acid 2 ml $PdCl_2$ 0.03 g | Copper sulfate 3.5 g Salt of tartaric acid 8.5 g Formalin (37%) 22 ml Thiourea 1 g Ammonia 40 g |

Comparative Example 1

A copper pattern film having a predetermined pattern was obtained as in Example 1, except that the activation treatment was not performed using a palladium compound, and only the sensitization treatment was performed. The material properties of the copper pattern film so obtained were evaluated, and the results thereof are given in the following Table 2.

Comparative Example 2

A copper pattern film having a predetermined pattern was obtained as in Example 1, except that the sensitization treatment was not performed, and the activation treatment was performed using only the palladium activation solution used in Example 1. The material properties of the comparative copper pattern film so obtained were evaluated, and the results thereof are given in the following Table 2.

Comparative Example 3

A copper pattern film having a predetermined pattern was obtained as in Example 1, except that a tin chloride solution (a mixed solution of 10 g/L $SnCl_2$ and 40 ml/L of conc. HCl (37 wt % aq.) in water) was used as a sensitization solution instead of an aqueous copper sulfate solution. The material properties of the comparative copper pattern film so obtained were evaluated, and the results thereof are given in the following Table 2.

Experiment Example 1

Measurement of Adhesivity

Figure 7A:
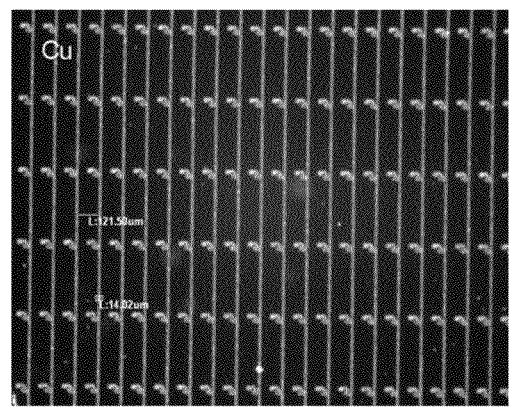
FIG. 7A to 7c are views showing the results of measuring the adhesivity of the exemplary copper pattern obtained in Comparative Examples 1 to 3.
Figure 7B:
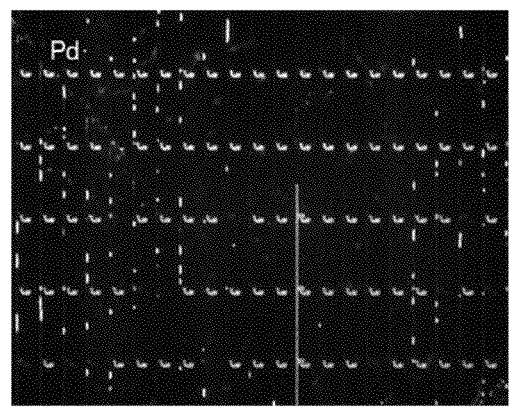
Figure 7C:
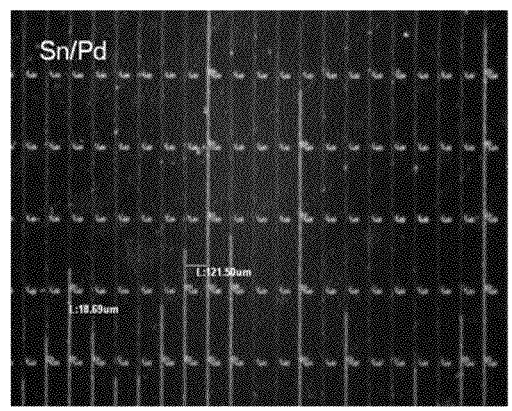
Figure 8:
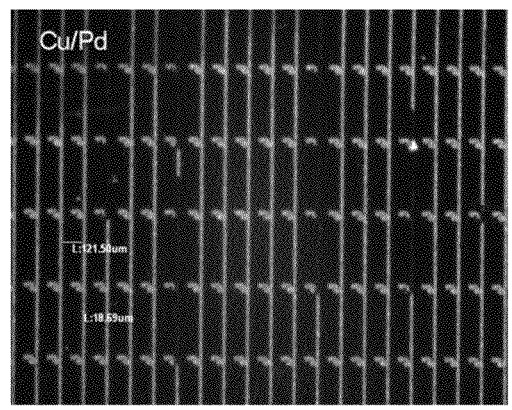
FIG. 8 is a view showing the result of measuring the adhesivity of the exemplary copper pattern obtained in Example 1.

In the patterned metal structure (thickness 4500 Å, width 7 μm) obtained in Example 1, the adhesivity of the plated layer was tested by tape pull test using adhesive tape, and the results thereof are shown in FIG. 8. Meanwhile, the adhesivity of the plated layer obtained in Comparative Examples 1 to 3 was evaluated, and the results thereof were shown in FIG. 7A to 7C.

As shown in FIGS. 7A to 7C and 8, in the case of Comparative Example 1, the adhesivity of a plated layer was good, but the specific resistance of the plated layer was undesirably high since $Cu_2O$ was formed on the plated layer. In the case of Comparative Example 2, in which only the activation treatment was performed using palladium, it was found that the adhesivity of the plated layer was insufficiently low, so that the plated layer completely peeled off when the adhesive tape adhered thereto was pulled to separate it from the plated layer. Meanwhile, in the case of Comparative Example 3, in which a tin compound was used as a sensitizing agent and the activation treatment was performed using a palladium activation solution, the adhesivity was somewhat improved compared to Comparative Example 2, but was insufficient compared to Example 1. That is, in the case of Example 1, in which a copper compound was used as a sensitizing agent and the activation treatment was performed using a palladium compound, the adhesivity of the plated layer was best.

Experimental Example 1

Measurement of Specific Resistance

Figure 9:
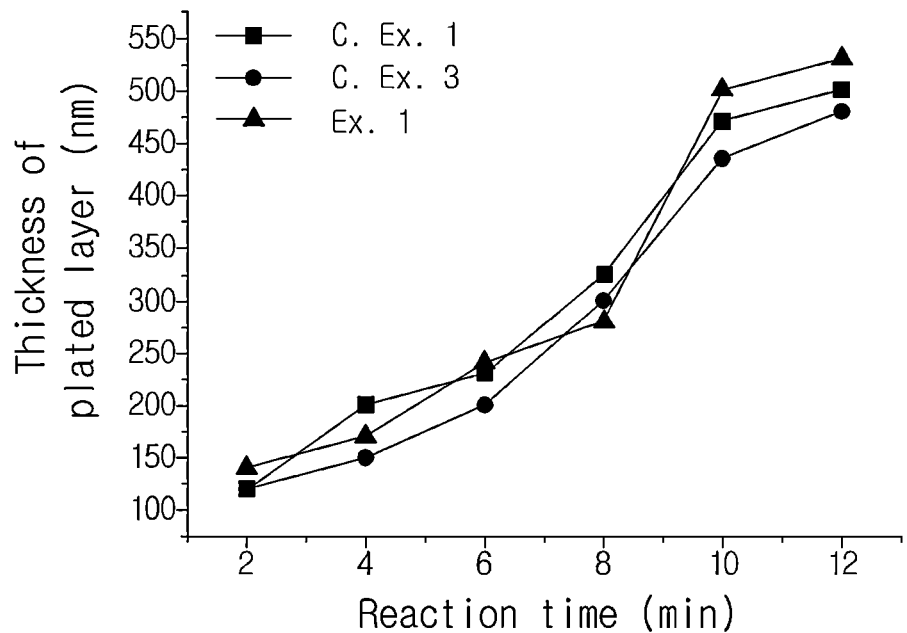
FIG. 9 is a graph showing the change in thickness of plated layers depending on reaction time in the exemplary copper pattern obtained in Example and Comparative Examples.

The specific resistances of each of the metal pattern film obtained in Example 1 and Comparative Example 1 to 3 were measured at thicknesses of both 300 nm and 450 nm, and the results thereof are given in Table 2. The thickness thereof was measured using a Surface profiler P-10, manufactured by Tencor corp., and the specific resistance thereof was measured using a 4 point probe. The change in the thickness of a plated layer was measured by observing the change in the reaction time in Example 1 and Comparative Example 1 to 3, and the results thereof are shown in FIG. 9. Further, the change in the specific resistance of a plated layer was measured depending on the thickness thereof, and the results thereof are shown in FIG. 10.

TABLE 2

| Examples | Specific resistance (μ ohm-cm) Thickness of plated layer 300 nm | Specific resistance (μ ohm-cm) Thickness of plated layer 450 nm | Peeling test |
|---|---|---|---|
| Comparative Example 1 (Cu) | 3.0 | 2.8 | 0/140 |
| Comparative Example 2 (Pd) | Measurement impossible | Measurement impossible | 88/140 |
| Comparative Example 3 (Sn/Pd) | 2.9 | 2.4 | 69/140 |
| Example 1 (Cu/Pd) | 2.6 | 2.5 | 24/140 |

Figure 10:
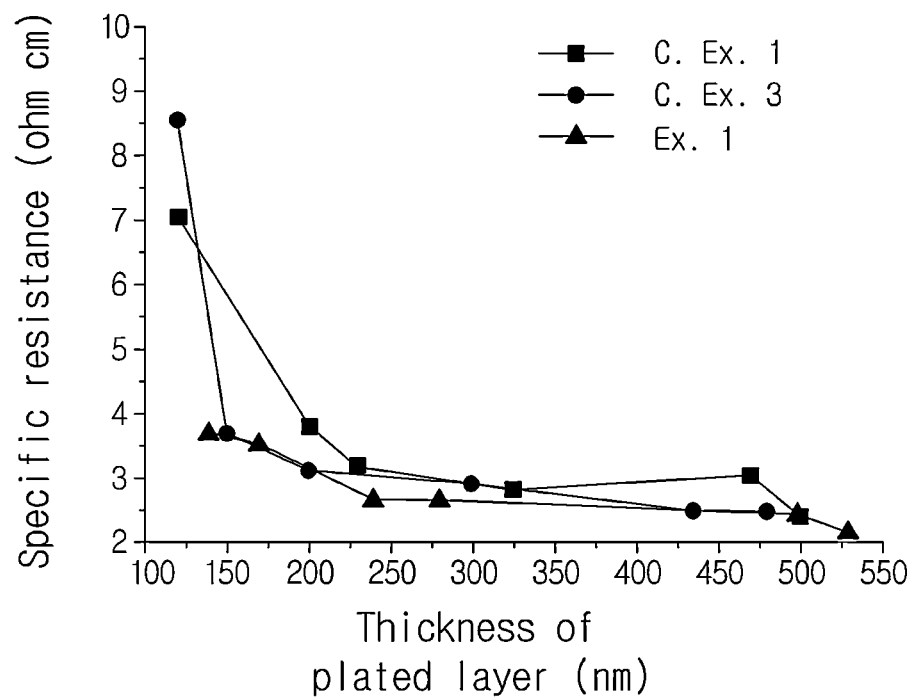
FIG. 10 is a graph showing the change of specific resistance depending on the thickness of plated layers in the exemplary copper pattern obtained in Example and Comparative Examples.

As shown in Table 2 and FIGS. 9 to 10, the growth rate of the copper electroless plated layer in Example 1 was similar to that in Comparative Examples 1 to 3. However, the specific resistance in Comparative Example 1 was the highest, and the specific resistance in Comparative Example 2, in which the plated layer includes palladium, was similar to that of Example 1. In the case of Comparative Example 2, in which the activation treatment was performed using a palladium compound, the specific resistance of the plated layer could not be measured due to a strong peeling phenomenon.

Figure 11:
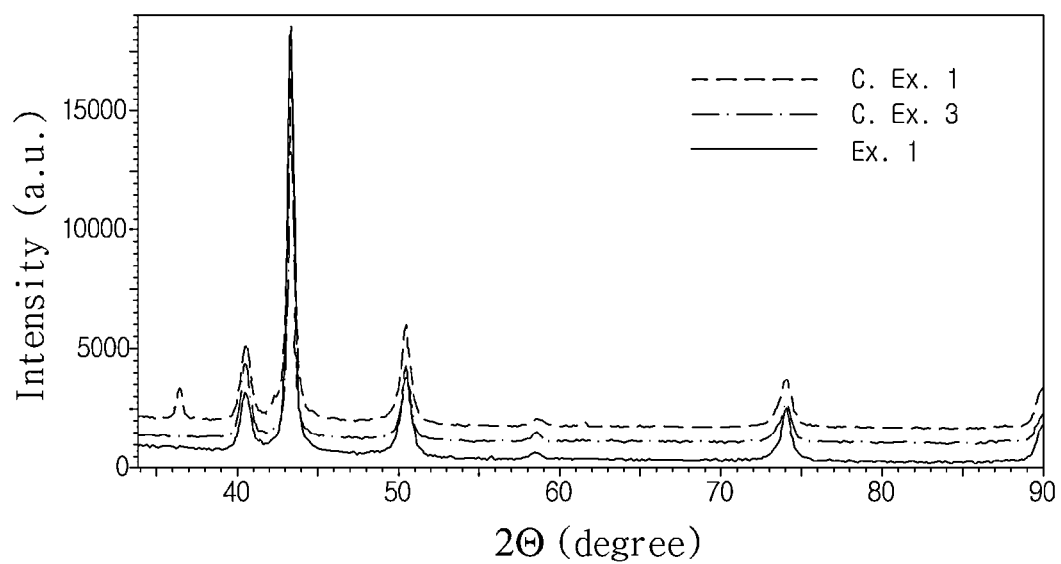
FIG. 11 is the X-ray diffraction spectra of the exemplary copper pattern obtained in Example and Comparative Examples.

FIG. 11 is a graph showing the results of X-ray diffraction analysis of copper pattern films obtained in Example 1 and Comparative Examples 1 and 3. As shown in FIG. 11, in the case of Comparative Example 1, since copper oxide ($CuO_2$) peaks exist at a 2Θ of 36.6° (111) and 42.5° (200), and copper (Cu) peaks exist at a 2Θ of 43.3° (111) and 50.5° (200), it is predicted that the plated layer includes $Cu_2O$ in addition to Cu. However, in the case of Comparative Example 3 and Example 1, in which the activation treatment was performed using palladium, the oxide peaks did not exist.

As seen in the above results in which, at the time of electroless plating, a copper compound was used as the sensitization agent and a palladium compound was used as the activation agent, the adhesivity and specific resistance of the plated film prepared thereby were found to provide the best results.

According to the method of forming metal pattern, a low-resistance metal pattern can be obtained efficiently by a wet film formation process without undergoing a conventional sputtering process, which requires high-temperature and high-vacuum conditions. Accordingly, the present invention can be used to reduce equipment investment and manufacturing costs. Moreover, the method of forming metal pattern can also be applied to a flexible substrate, and the metal pattern can be continuously produced by a roll-to-roll process, thereby significantly improving productivity.

The metal pattern has improved adhesivity and specific resistance for the plated layer relative to a plated layer prepared without the sensitization treatment using a copper compound and the activation treatment of the substrate, so that the reliability and price competitiveness of display devices using the patterned metal structure of the present invention can also be improved.

As described above, although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A method of forming a metal pattern, in which the metal pattern is formed by forming a plurality of metal cores by: performing sensitization treatment of a surface of a substrate with a copper compound, activating the sensitized surface of the substrate by activation treatment of the substrate, and forming a plated layer on the activated surface of the substrate, and wherein the method comprises:
    forming a conductive patterned film on a surface of an insulated substrate;
    performing sensitization treatment on the conductive pattern film by immersing the conductive pattern film into a sensitization solution including the copper compound to form a sensitized pattern film;
    activating the sensitized substrate by immersing the sensitized pattern film into an activation solution containing palladium, a palladium alloy, or palladium chloride to form an patterned activated multi-layered catalyst film comprising a plurality of catalyst metal cores thereon; and
    forming one or more plated layers on the surface of the patterned activated multi-layered catalyst film.

2. The method of forming metal pattern according to claim 1, wherein forming the conductive pattern film comprises:
    forming a metal thin film on a surface of the insulated substrate;
    forming a photosensitive film on a surface of the metal thin film opposite the insulated substrate;
    patterning the photosensitive film by selectively exposing and developing the photosensitive film using a mask; and
    etching the exposed underlying regions of metal thin film in the patterned photosensitive film.

3. The method of forming metal pattern according to claim 1, wherein the copper compound is copper, a copper alloy, copper sulfate, or copper chloride.

4. The method of forming metal pattern according to claim 1, wherein forming a plated layer is performed using a wet electroless plating method or a wet electrolytic plating method.

5. The method of forming metal pattern according to claim 1, wherein, in forming a plated layer, a metal for plating is selected from the group consisting of Ni, Cu, Ag, Au, and alloys thereof.

6. The method of forming metal pattern according to claim 1, wherein forming a plated layer is performed by immersing the sensitized and activated conductive pattern film into a copper electroless plating solution including a copper salt, a complexing agent, a reductant, and a pH adjuster.

7. The method of forming metal pattern according to claim 2, wherein the metal thin film is formed of a conductive material selected from the group consisting of molybdenum, nickel, copper, titanium, tantalum, tungsten, and alloys thereof.

8. The method of forming metal pattern according to claim 1, further comprising forming a protective layer on the plated layer.

9. The method of forming metal pattern according to claim 8, wherein the protective layer comprises nickel or a nickel alloy.

10. The method of forming metal pattern according to claim 1, further comprising annealing a metal pattern after the formation of the metal pattern by forming a plated layer.

11. The method of forming metal pattern according to claim 10, wherein annealing is performed under a nitrogen, argon or vacuum atmosphere at about 40 to about 400° C. for about 15 to about 120 minutes.

* * * * *